(12) United States Patent
Hsieh et al.

(10) Patent No.: US 8,279,008 B2
(45) Date of Patent: Oct. 2, 2012

(54) CMOS MILLIMETER-WAVE VARIABLE-GAIN LOW-NOISE AMPLIFIER

(75) Inventors: Hsieh-Hung Hsieh, Taipei (TW); Po-Yi Wu, Baoshan (TW); Ho-Hsiang Chen, Hsinchu (TW); Chewn-Pu Jou, Chutung (TW); Fu-Lung Hsueh, Cranbury, NJ (US)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 12/851,705

(22) Filed: Aug. 6, 2010

(65) Prior Publication Data

US 2012/0032742 A1 Feb. 9, 2012

(51) Int. Cl.
*H03G 3/30* (2006.01)
*H03F 1/22* (2006.01)
*H03F 3/16* (2006.01)

(52) U.S. Cl. .................. 330/285; 330/310; 330/311

(58) Field of Classification Search .......... 330/310–311, 330/133, 150, 98, 302
See application file for complete search history.

(56) References Cited

U.S. PATENT DOCUMENTS

| | | | |
|---|---|---|---|
| 7,403,071 B2 | 7/2008 | Hollenbeck et al. | |
| 7,456,691 B2 * | 11/2008 | Minichshofer | 330/289 |
| 7,629,850 B2 | 12/2009 | Floyd et al. | |
| 7,944,311 B1 * | 5/2011 | Jeon et al. | 330/311 |
| 2007/0273445 A1 | 11/2007 | Sarkar et al. | |

OTHER PUBLICATIONS

Natarajan, A. et al., "A 60GHz Variable-Gain LNA in 65 nm CMOS", IEEE Asian Solid State Circuits Conference, Nov. 3-5, 2008, Fukuoka, Japan, 4 pages.

Hsieh, H.H., "A 40-GHz Low-Noise Amplifier With a Positive-Feedback Network in 0.18-μm CMOS", IEEE Transactions on Microwave Theory and Techniques, Aug. 2009, 57(8):1895-1902.

Mimino, Y. et al., "A 60 GHz Millimeter-wave MMIC Chipset for Broadband Wireless Access System Front-end", IEEE MTT-S Digest, 2002, TH3A-2, pp. 1721-1724.

Pellerano, S. et al., "A 64GHz 6.5dB NF 15.5dB Gain LNA in 90nm CMOS", IEEE Solid State Circuits Conference, Sep. 2007, pp. 352-355.

Yao, T. et al., Algorithmic Design of CMOS LNAs and PAs for 60-GHz Radio, IEEE Journal of Solid-State Circuits, May 2007, 42(5):1044-1057.

Doan, C.H. et al., "Millimeter-Wave CMOS Design", IEEE Journal of Solid-State Circuits, Jan. 2005, 40(1):144-155.

Nishikawa, K. et al., "0.4 V, 5.6 mW InP HEMT V-band Low-Noise Amplifier MMIC", Microwave Symposium Digest, Jun. 2006, pp. 810-813.

Fujihara, A. et al., "High Performance 60-GHz Coplanar MMIC LNA Using InP Heterojunction FETs with AlAs/InAs Superlattice Layer", IEEE MTT-S Digest, 2000, TU2A-4, pp. 21-24.

Handa, S. et al., "60GHz-band Low Noise Amplifier and Power Amplifier Using InGaP/GaAs HBT Technology", IEEE GaAs Digest, 2003, pp. 227-230.

* cited by examiner

*Primary Examiner* — Hieu Nguyen
(74) *Attorney, Agent, or Firm* — Duane Morris LLP

(57) ABSTRACT

A low-noise amplifier (LNA) includes a first cascode gain stage coupled to an input node for increasing an amplitude of an RF input signal. A first variable gain network is coupled to the first cascode gain stage and includes a first inductor for boosting a gain of the first cascode gain stage, a first capacitor coupled to the first inductor for blocking a direct current (DC) voltage, and a first switch coupled to the first inductor and to the first capacitor. The first switch is configured to selectively couple the first inductor to the first cascode gain stage in response to a first control signal.

19 Claims, 9 Drawing Sheets

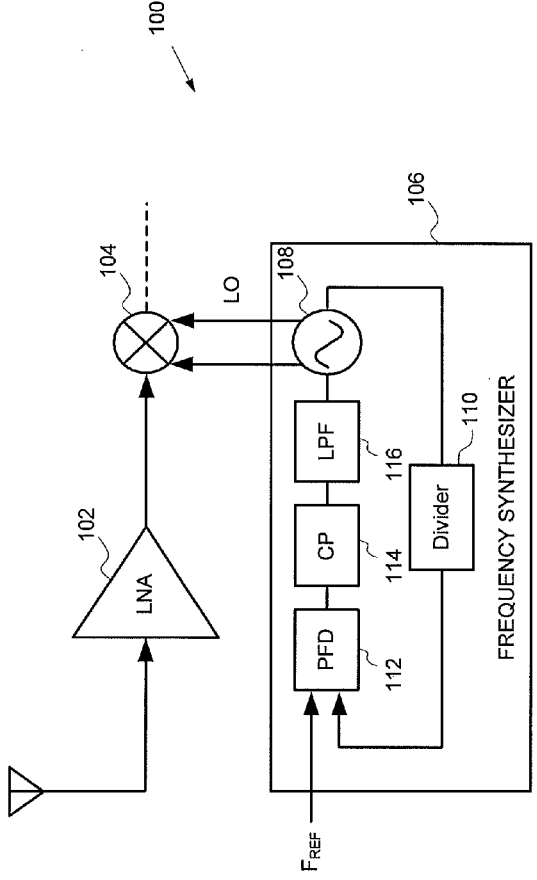
FIG. 1A (PRIOR ART)
FIG. 1B (PRIOR ART)
FIG. 1C (PRIOR ART)

CMOS MILLIMETER-WAVE VARIABLE-GAIN LOW-NOISE AMPLIFIER

FIELD OF DISCLOSURE

The disclosed system and method relate to millimeter wave receivers. More specifically, the disclosed system and method relate to millimeter wave receivers including a low noise amplifiers having variable gain control.

BACKGROUND

Millimeter-wave frequencies generally refer to signals in the frequency band between approximately 30 GHz to 300 GHz, which are frequently used in various applications such as wireless personal area networks (WPANs), automobile radar, and image sensing. FIG. 1A illustrates a block diagram of one example of a millimeter wave receiver 100 including a low noise amplifier (LNA) 102, a mixer circuit 104, and a frequency synthesizer 106. Frequency synthesizer 106 includes a voltage controlled oscillator (VCO) 108, a divider circuit 110, a phase frequency detector (PFD) 112, a charge pump (CP) 114, and a low pass filter (LPF) 116.

As illustrated in FIG. 1A, the first active component of a millimeter wave receiver 100 is the LNA 102. Various LNAs for millimeter waves have been disclosed. For example, millimeter-wave LNAs were initially implemented in Group III-V compound semiconductors or implemented using cascode amplifiers based on binary junction transistor (BJT) technology. However, LNAs implemented using compound III-V semiconductors or BJTs are not easily integrated with the other components of the receiver, especially for digital circuits, resulting in higher implementation costs.

Recent advances in complementary metal oxide semiconductor (CMOS) technologies have enabled millimeter-wave integrated circuits to be implemented at lower costs as multi-stage LNAs. However, these multi-stage LNAs experience passive losses across the input, inter-stage, and output matching networks, which lead to insufficient gain. Consequently, the amplitude of the amplified signal after the LNA is too small to be accurately processed by the rest of the circuitry of receiver 100 illustrated in FIG. 1A.

Variable gain LNAs select the appropriate gain based on the distance between the transmitter and receiver. For example, when a transmitting antenna 120 is located at a distance D1 that is far away from a receiving antenna 118 as illustrated in FIG. 1B, the high gain mode of operation for the LNA 102 is selected. Conversely, when the receiving antenna 118 is positioned at a distance D2 that is close to the transmitting antenna 120 as shown in FIG. 1C, the low-gain mode of operation for the LNA 102 is selected.

However, the gain of the CMOS millimeter-wave variable gain LNAs are restricted due to the high-frequency operation. For example, the cascade of cascode gain stages to boost the gain results in an increase in passive losses and the inability to efficiently boost the gain when the direct current (DC) power increases. Additionally, these variable gain LNAs have a small dynamic range and thus the components of the LNAs must be carefully selected for specific applications.

SUMMARY

In some embodiments, a low-noise amplifier (LNA) includes a first cascode gain stage coupled to an input node for increasing an amplitude of an RF input signal. A first variable gain network is coupled to the first cascode gain stage and includes a first inductor for boosting a gain of the first cascode gain stage, a first capacitor coupled to the first inductor for blocking a direct current (DC) voltage, and a first switch coupled to the first inductor and to the first capacitor. The first switch is configured to selectively couple the first inductor to the first cascode gain stage in response to a first control signal.

In some embodiments, a low-noise amplifier (LNA) includes a plurality of cascode gain stages for increasing an amplitude of a radio frequency (RF) input signal and at least one variable gain network coupled to one of the plurality of cascode gain stages. The at least one variable gain network includes an inductor for boosting a gain of the cascode gain stage to which the variable gain stage is coupled. A capacitor is coupled to the first inductor for blocking a direct current (DC) voltage, and a switch is coupled to the inductor and to the capacitor for selectively coupling the inductor to the cascode gain stage in response to a control signal.

A method is also disclosed in which a radio frequency (RF) signal is received at an input node coupled to a first cascode gain stage. An amplitude of the RF signal is increased at the cascode gate stage, and a first gain boosting inductor of a first variable gain network is coupled to the first cascode gain stage to further increase the amplitude of the RF signal.

BRIEF DESCRIPTION OF THE DRAWINGS

FIG. 1A is a block diagram of a millimeter-wave receiver.
FIGS. 1B and 1C illustrate a millimeter-wave receiver disposed at different distances from a transmitter.

DETAILED DESCRIPTION

Being the first active receiver circuit after the antenna, the low-noise amplifier ("LNA") is a critical building block for radio transceivers as it impacts both ends of the dynamic range of the receiver. To improve receiver sensitivity or reduce receiver noise figure, LNAs are implemented with low noise figures and high-power gains to further deemphasize noise contributions downstream in the receiver. However, it is also beneficial to implement LNAs with low-power gains to improve receiver linearity since the total receiver linearity is often determined by a down-conversion mixer and implementing a lower gain in front of the mixer means that a higher input signal level can be processed before the mixer enters the nonlinear regime.

Figure 2A:
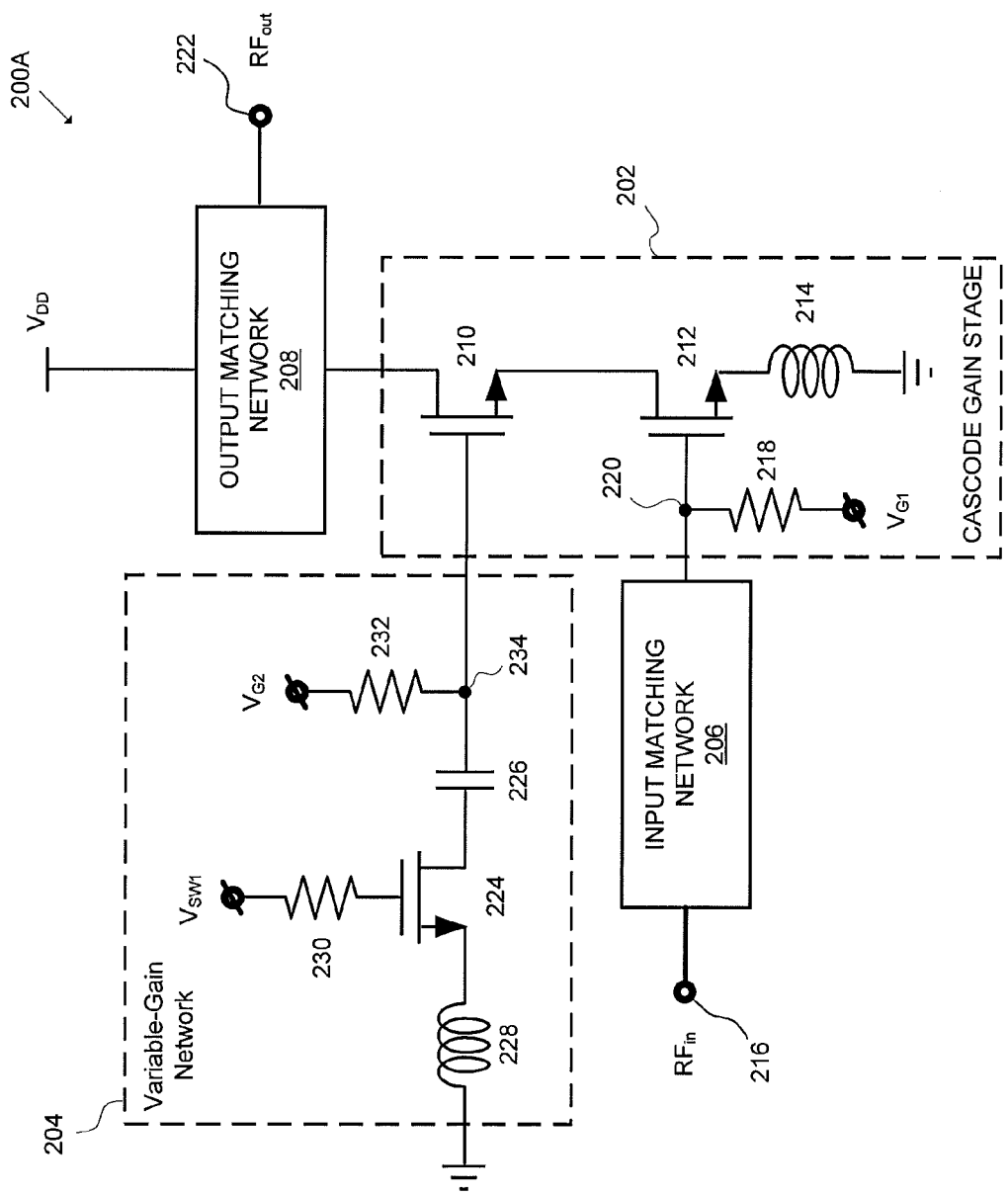
FIG. 2A is a schematic diagram of one example of an improved single stage low-noise amplifier.

FIG. 2A is a block diagram of one example of an improved millimeter-wave low-noise amplifier LNA 200A that advantageously may have a high and low gain modes that are switched based on a strength of a received input signal and exhibits improved stability compared to conventional LNAs. As shown in FIG. 2A, LNA 200A includes a single cascode gain stage 202, a variable gain network 204, an input matching network 206, and an output matching network 208.

Cascode gain stage 202 includes a common gate transistor 210 having its source coupled to a drain of a common source transistor 212, which has its source coupled to ground through inductor 214. The gate of common source transistor 212 is coupled to an input node 216 for receiving a radio frequency (RF) input signal through input matching network 206. A resistor 218 may be coupled to a voltage source node $V_{G1}$ for biasing the gate voltage of common source transistor 212 and to node 220 disposed between input matching network 206 and the gate of common source transistor 212.

The gate of common gate transistor 210 is coupled to ground through variable gain network 204, and the drain of common gate transistor 210 is coupled to an output node 222 through output matching network 208, which may be coupled to a voltage supply node set at $V_{DD}$. Variable gain network 204 includes a switch 224, which may be a MOS transistor having a drain (or source) coupled to the gate of common gate transistor 210 through a capacitor 226. The source (or drain) of MOS transistor switch 224 is coupled to ground through an inductor 228, and the gate of transistor 224 is coupled to a control voltage, $V_{SW1}$, through a resistor 230. Another resistor 232 may be disposed between capacitor 226 and the gate of common gate transistor 210 at node 234.

Figure 2B:
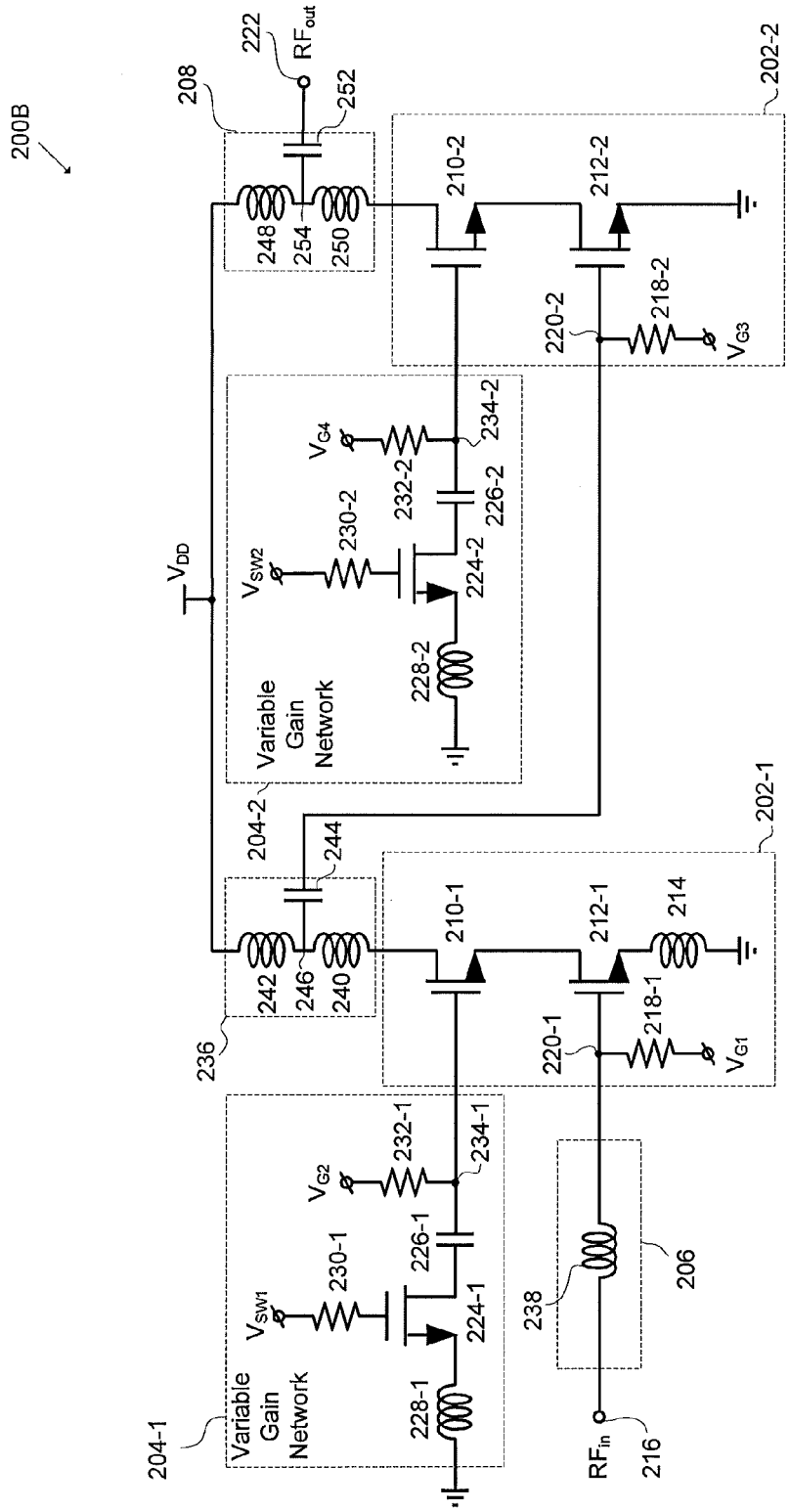
FIG. 2B is a schematic diagram of one example of an improved two stage low-noise amplifier.

The single-stage LNA 200A may be cascaded to provide a multiple stage LNA. For example, FIG. 2B illustrates an LNA 200B having two cascode gain stages 202-1 and 202-2. Each of the cascode gain stages 202-1, 202-2 includes a common-gate transistor 210-1, 210-2 having a source coupled to a drain of a common source transistor 212-1, 212-2. The gates of the common gate transistors 210-1, 210-2 are coupled to ground through a variable gain network 204-1, 204-2.

Common source transistor 212-1 has its source coupled to ground through an inductor 214, and its gate coupled to an input node 216 configured to receive an RF input signal through an input matching network 206. A resistor 218-1 is coupled between a gate biasing voltage $V_{G1}$ and a node 220-1 disposed between the gate of common source transistor 212-1 and the input matching network 206. Common source transistor 212-2 has its source coupled to ground and its gate coupled to inter-stage matching network 236, which is also coupled to the drain of common gate transistor 210-1. A resistor 218-2 is coupled between a biasing voltage $V_{G3}$ and node 220-2, which is disposed between the gate of common source transistor 212-2 and the inter-stage matching network 236.

Each variable gain network 204-1, 204-2 includes a switch 224-1, 224-2 coupled between a gate of common gate transistor 210-1, 210-2 and ground. Switches 224-1, 224-2 may be MOS transistors each having their sources (or drains) coupled to ground through an inductor 228-1, 228-2, their drains (or sources) coupled to the gate of common gate transistor 210-1, 210-2 through a capacitor 226-1, 226-2, and their gates coupled to a respective control voltage $V_{SW1}$, $V_{SW2}$ through a resistor 230-1, 230-2.

Input matching network 206 may include a single inductor 238, although one skilled in the art will understand that input matching network may include a plurality of inductors as well as one or more capacitors to form an LC ladder. Inter-stage matching network 236 includes an LC ladder comprising a first inductor 240 coupled to the drain of common gate transistor 210-1 and a second inductor 242 coupled to the first inductor 240 and to a voltage supply node set at $V_{DD}$.

Capacitor 244 is coupled to the gate of common source transistor 212-2 of the second cascode gain stage 202-2 and to node 246, which is disposed between inductors 240 and 242.

Output matching network 208 includes an inductor 248 coupled to voltage source node $V_{DD}$ and to another inductor 250, which is coupled to the drain of common gate transistor 210-2. Capacitor 252 is coupled to output node 222 and to node 254, which is disposed between inductors 248 and 250.

Figure 2C:
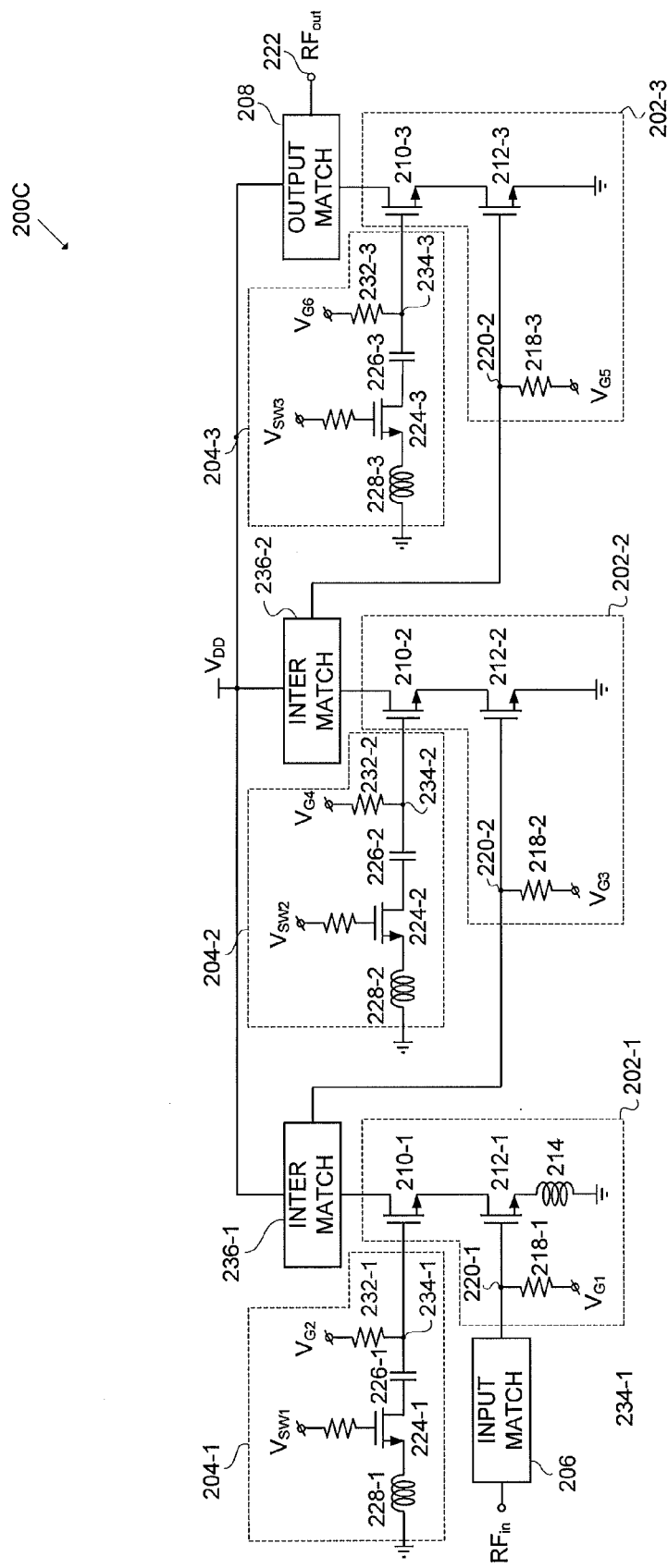
FIG. 2C is a schematic diagram of one example of an improved three stage low-noise amplifier.

One skilled in the art will understand that the number of cascaded cascode stages is not limited to two. For example, FIG. 2C illustrates a three stage LNA 200C including three cascode gain stages 202-1, 202-2, and 202-3 each coupled to a respective variable gain network 204-1, 204-2, and 204-3. The descriptions of components of LNA 200C that are the same as those of LNA 200B are not repeated.

Figure 2D:
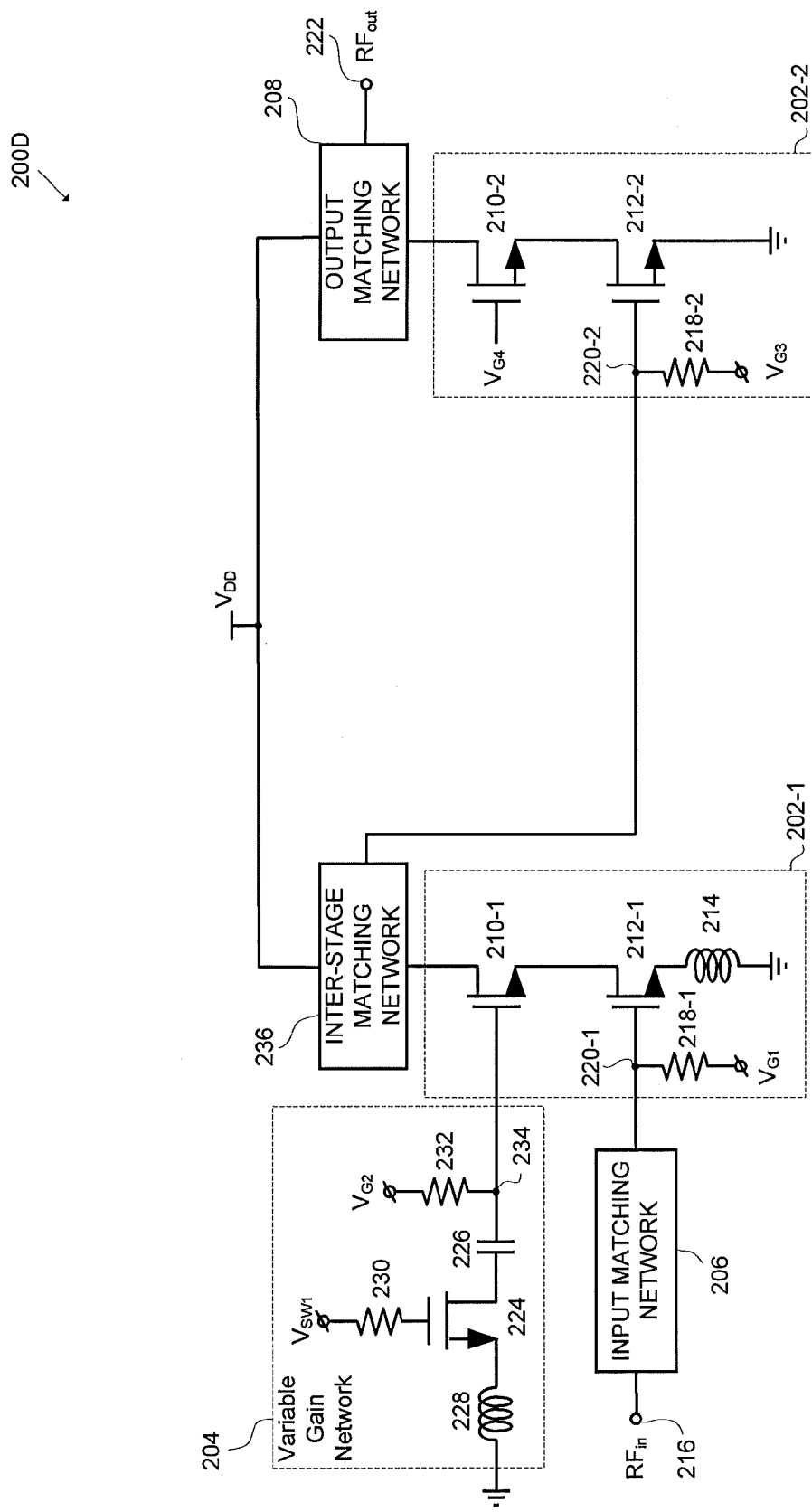
FIG. 2D is a schematic diagram of another example of an improved two stage low-noise amplifier.
Figure 2E:
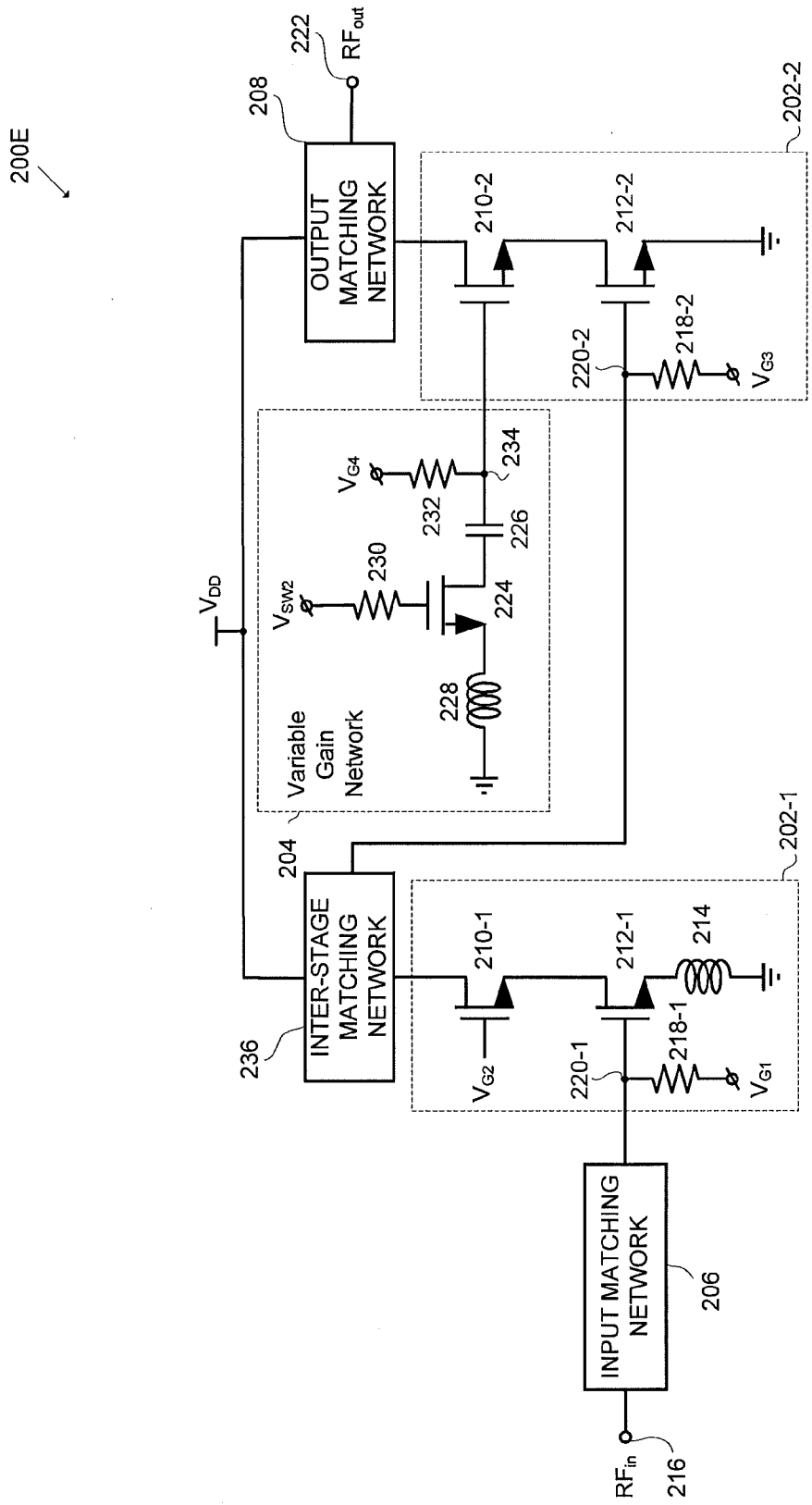
FIG. 2E is a schematic diagram of another example of an improved two stage low-noise amplifier.

In some embodiments, an improved LNA may be implemented with a plurality of cascode gain stages 202 with only one of the cascode gain stages being coupled to a variable gain network 204. For example, FIG. 2D illustrates one example of an LNA 200D including two cascode gain stages 202-1 and 202-2 with a variable gain network 204 coupled to cascode gain stage 202-1. FIG. 2E illustrates another example of an LNA 200E including two cascode gain stages 202-1 and 202-2 with a variable gain network coupled to cascode gain stage 202-2. Accordingly, one skilled in the art will understand that the number of cascode gain stages 202 and variable gain networks 204 may be varied as may the cascode gain stage 202 to which a variable gain stage 204 may be coupled.

In operation, the single stage LNA 200A receives an input signal at input node 216 and LNA 200A amplifies the received RF signal. Switch 224 of variable gain network 204 selectively couples gain boosting inductor 228 to the gate of common gate transistor 210 for increasing the gain of cascode gain stage 202. The selective coupling of gain boosting inductor 228 to the gate of common gate transistor 210 is controlled by the voltage coupled to the gate of switch 224 through resistor 230.

Figure 3:
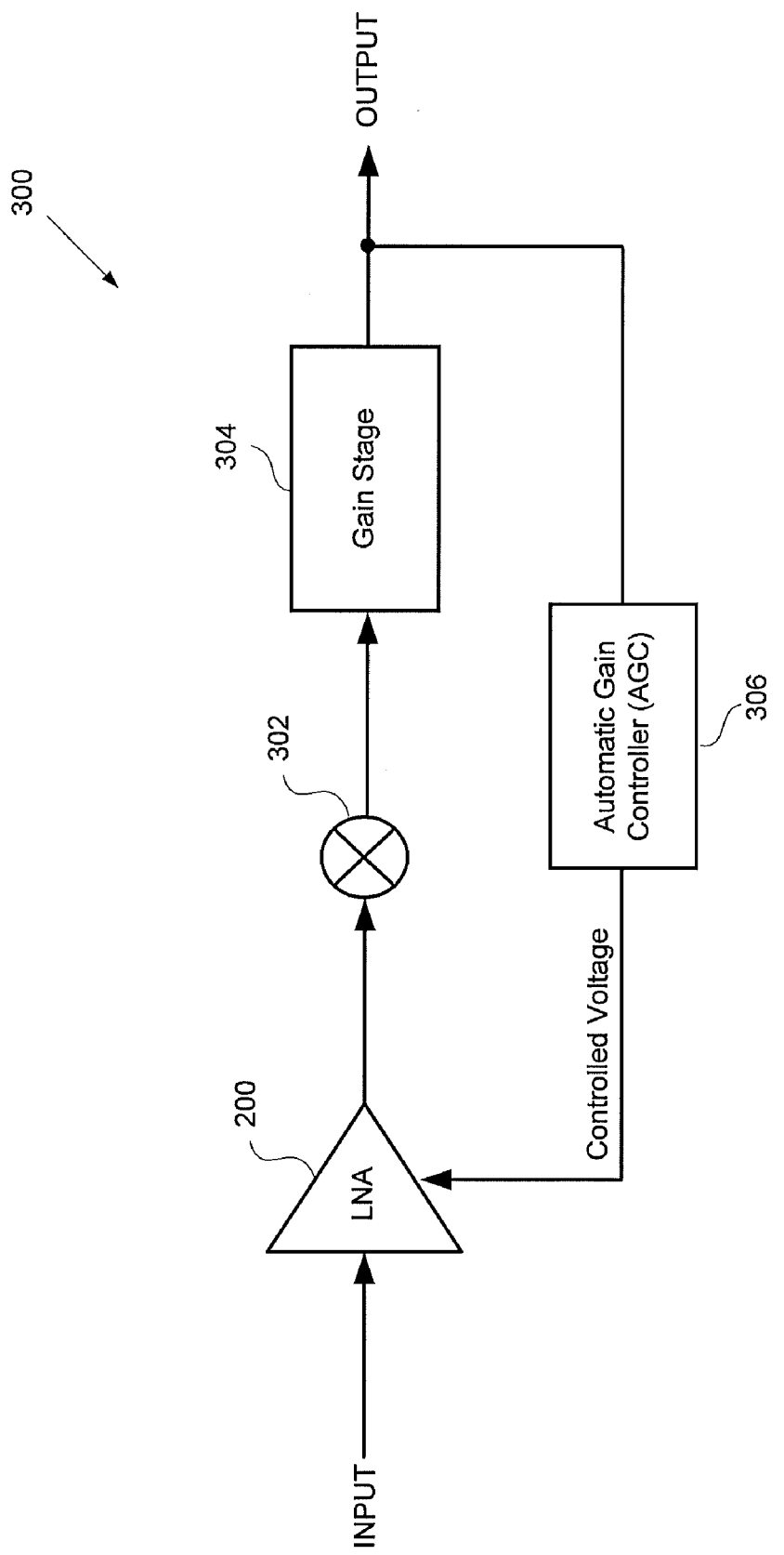
FIG. 3 illustrates one example of a system including a low noise-amplifier.

The opening and closing of switch 224 may be controlled by a feedback loop 300 as shown in FIG. 3. Feedback loop 300 includes LNA 200, a mixer circuit 302, a gain stage 304, and an automatic gain controller (AGC) 306. An input of a mixer 302 is coupled to an output of the LNA 200. An output of the mixer 302 is connected to an input of a gain stage 304, which may have a fixed or variable gain. An output of the gain stage 304 is connected to an input of AGC 306, which has its output coupled to another input of the LNA 200. One skilled in the art will understand that additional gain stages or attenuators (not shown) may be provided between the mixer 302 and gain stage 304 and/or gain stage 304 and output of the feedback loop.

In operation, an RF signal is linearly amplified by the LNA 200 and then passed to the mixer 302, which down-converts the linearly amplified RF signal to a baseband frequency. Mixer 302 supplies the down-converted RF signal to gain stage 304, which amplifies the down-converted signal by a predetermined amount and then supplies the amplified signal to AGC 306. The gain of LNA 200 is adjusted by an amount determined by the controlled voltage supplied from AGC 306. AGC 306 receives a feedback signal of the amplified signal from the gain stage 304 and uses the feedback signal to adjust the controlled voltage, and thus, the amount of gain in LNA 200. For example, if the output of the feedback loop is larger than a desired output voltage, then AGC 306 controls the variable gain LNA 200 to decrease the amount of gain, i.e., switch 224 is open. On the other hand, if the output of the feedback loop is smaller than the desired output voltage, then AGC 306 controls the variable gain LNA 306 to increase the amount of gain, i.e., switch 224 is closed.

The finite resistance of switch 224 when it couples gain boosting inductor 228 to the gate of common gate transistor 210 advantageously enhances the stability of the LNA. Capacitor 226 blocks direct current (DC) voltages and assists in biasing the gate terminal of common gate transistor 210 and switch 224 for controlling the coupling of inductor 228 to the gate of transistor 210. Inductor 214 coupled to the source of common source transistor 212 enables input and noise matching to be obtained. When the voltage applied to the gate of switch 224 is below the threshold voltage and the switch is open, the switch 224 has a large resistance that reduces the gain of cascode gain stage 202.

In multi-stage LNAs 200B, 200C having a plurality of variable gain networks 204, each of the switches 224 may be individually controlled by an AGC 306 to selectively couple a gain boosting inductor 228 to the gate of a common gate transistor 210. Additionally, the values of the components of the variable gain networks 204 may differ from one another such that the gain added by coupling a first gain boosting inductor 228 to the gate of a first common gate transistor 210 may differ from the gain added by coupling a second gain boosting inductor 228 to the gate of a second common gate transistor 210.

For example, LNA 200B may have four different operating modes: a low gain operating mode when switches 224-1 and 224-2 are open such that gain boosting inductors 228-1 and 228-2 are not coupled to the gate of common gate transistors 210-1 and 210-2; a first medium-gain mode in which switch 224-1 is closed and switch 224-2 is open such that gain boosting inductor 228-1 is coupled to the gate of common gate transistor 210-1; a second medium-gain mode in which switch 224-2 is closed and switch 224-1 is open such that gain boosting inductor 228-2 is coupled to the gate of common gate transistor 210-2; and a high gain mode in which both switches 224-1 and 224-2 are closed such that gain boosting inductors 228-1 and 228-2 are coupled to the gates of common gate transistors 210-1 and 210-2.

Figure 4B:
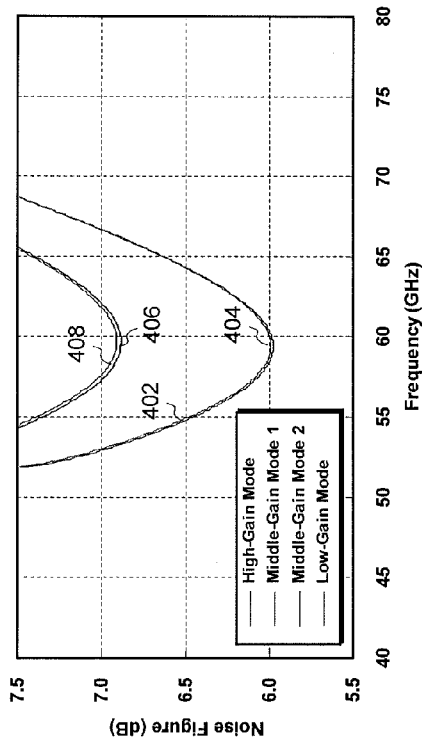
FIGS. 4A-4D illustrate various simulation results of a low-noise amplifier in accordance with FIG. 2B.
Figure 4D:
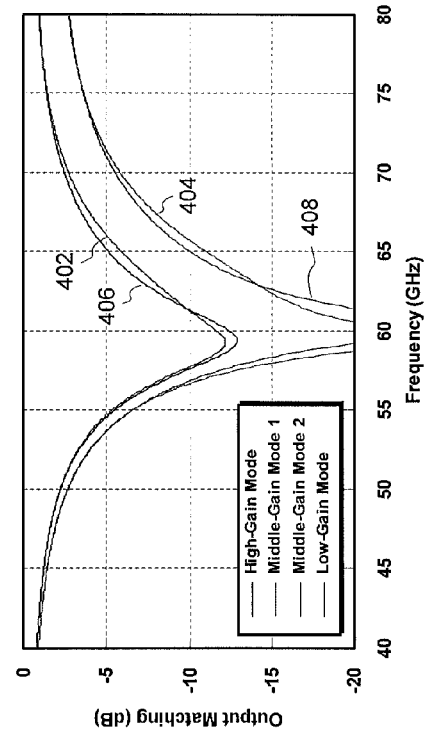
Figure 4A:
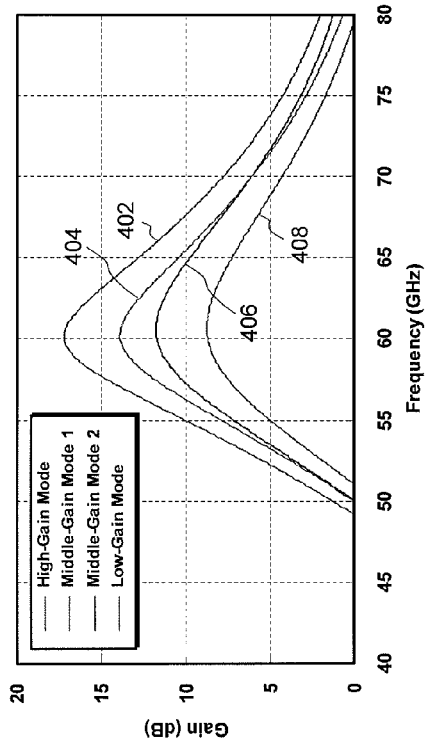
Figure 4C:
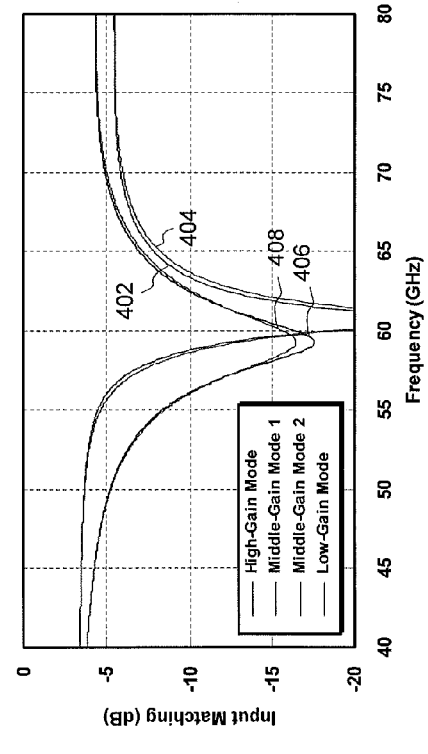

FIGS. 4A-4D illustrate various simulation results of the operation of an LNA 200B in accordance with FIG. 2B. Specifically, FIG. 4A is a graph illustrating the gain of LNA 200B in high-gain mode 402, a first medium-gain mode 404, a second medium-gain mode 406, and low-gain mode 408. As shown in FIGS. 4A-4D, the gain of the simulated LNA 200B in the high-gain mode 402 is 17.2 dB and the noise figure is 6 dB while the input and output matching are both smaller than −10 dB. In the low-gain mode, the simulated LNA 200B is 8.7 dB and the noise figure is 6.9 dB while the input and output matching are still both smaller than −10 dB. The simulation was performed with an input signal having a frequency of 60 GHz with inductors 228-1 and 228-2 having inductances of 60 pH and NMOS transistors 224-1 and 224-2 having lengths of 128 μm and widths of 60 nm. One skilled in the art will understand that the RF input signal and inductors 228-1 and 228-2 may have different values as may the lengths and widths of NMOS transistors 224-1 and 224-2.

Figure 5A:
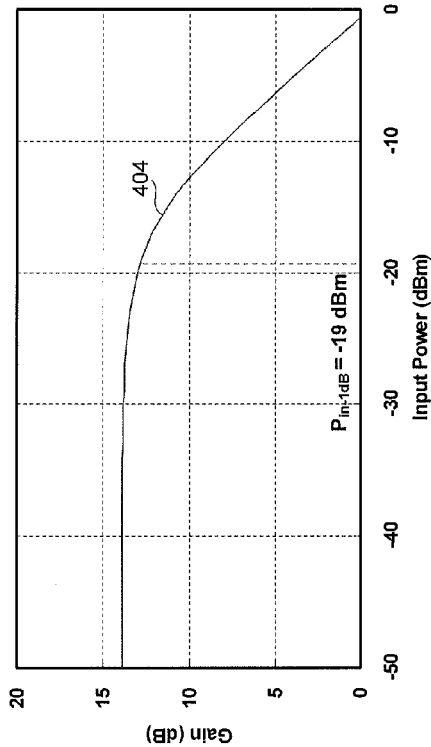
FIGS. 5A-5D illustrate the simulated linearity of a low-noise amplifier in accordance with FIG. 2B.
Figure 5B:
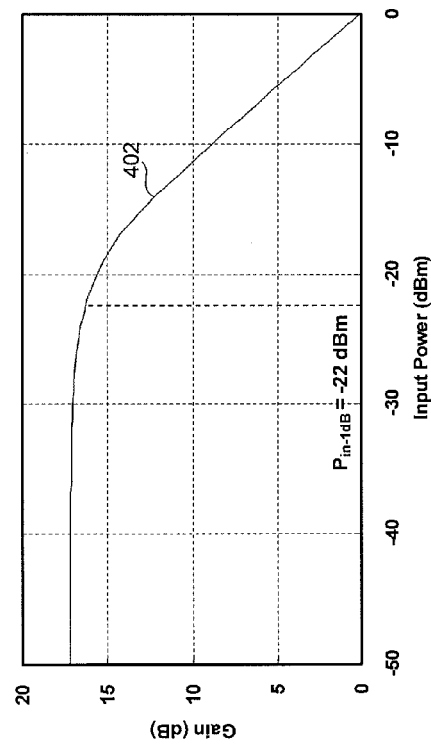
Figure 5C:
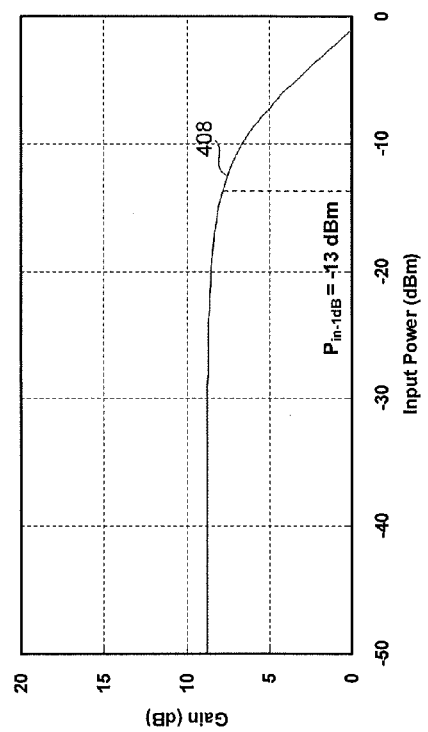
Figure 5D:
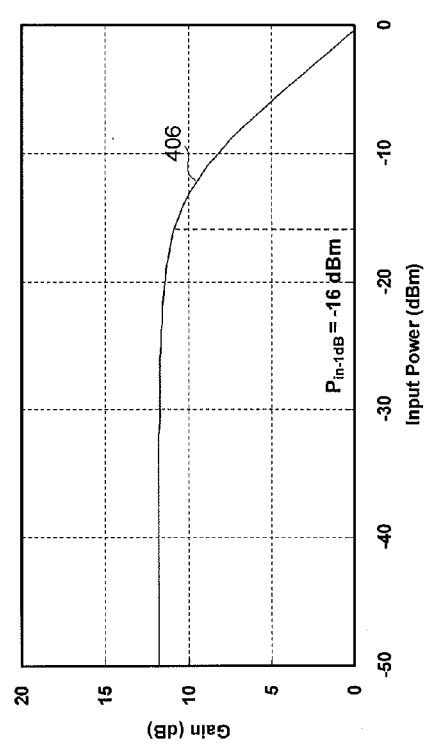

FIGS. 5A-5B are graphs illustrating the linearity (Pin-1 dB) of the LNA 200B for each of the operating modes 402-408. While the simulated LNA 200B demonstrates a 1 dB difference in noise figure between the high-gain mode 402 and the low-gain mode 408, the linearity is dramatically altered by 9 dB (−22 dBm to −13 dBm) as illustrated in FIGS. 5A-5D, which results at high linearity performance at the low-gain mode. Additionally, high sensitivity can be obtained in the high-gain mode since the gain is varied by 8.5 dB from the low-gain to high-gain mode with the variation of noise figure of 1 dB.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A low-noise amplifier (LNA), comprising:
a first cascode gain stage coupled to an input node for increasing an amplitude of an RF input signal received at the input node, the first cascode gain stage including:
a first transistor having a source coupled to ground and a gate coupled to the input node, and
a second transistor having a source coupled to a drain of the first transistor and a drain coupled to an output node; and
a first variable gain network coupled to a gate of the second transistor of the first cascode gain stage, the variable gain network including
a first inductor for boosting a gain of the first cascode gain stage,
a first capacitor coupled to the first inductor for blocking a direct current (DC) voltage, and
third transistor coupled to the first inductor and to the first capacitor, the third transistor configured to selectively couple the first inductor to the first cascode gain stage in response to a first control signal received at a gate of the third transistor to increase an inductance at the gate of the second transistor.

2. The LNA of claim 1, further comprising:
an input matching network coupled between the input node and the first cascode gain stage; and
an output matching network coupled between the output node and the first cascode gain stage.

3. The LNA of claim 1, further comprising:
a first inter-stage matching network coupled to the output node of the first cascode gain stage; and
a second cascode gain stage coupled to the second inter-stage matching network.

4. The LNA of claim 3, further comprising a second variable gain network including
a second inductor for boosting a gain of the second cascode gain stage,
a second capacitor coupled to the second inductor for blocking a direct current (DC) current, and
a second switch coupled to the second inductor and the second capacitor, the second switch configured to selectively couple the second inductor to the second cascode gain stage in response to a second control signal.

5. The LNA of claim 4, wherein the second switch is a MOS transistor.

6. The LNA of claim 3, further comprising:
a second inter-stage matching network coupled to an output of the second cascode gain stage;
a third cascode gain stage coupled to the second inter-stage matching network; and
a third variable gain network coupled to the third cascode gain stage.

7. The LNA of claim 6, wherein the third variable gain network includes a second inductor for boosting a gain of the third cascode gain stage, a second capacitor coupled to the second inductor for blocking a direct current (DC) voltage, and a second switch coupled to the second inductor and the second capacitor, the second switch configured to selectively couple the second inductor to the third cascode gain stage in response to a second control signal.

8. The LNA of claim 1, wherein the first control signal is received from an automatic gain control circuit coupled to an output of the LNA, the automatic gain control circuit generating the control signal based on an output voltage of the LNA.

9. A low-noise amplifier (LNA), comprising:
a plurality of cascode gain stages for increasing an amplitude of a radio frequency (RF) input signal each of the plurality of cascode gain stages including a first transistor having a source coupled to ground and a drain coupled to a source of a second transistor; and
at least one variable gain network coupled to a gate of the second transistor of at least one of the plurality of cascode gain stages, the at least one variable gain network including
an inductor for boosting a gain of the cascode gain stage to which the variable network stage is coupled,
a capacitor coupled to the first inductor for blocking a direct current (DC) voltage, and
a third transistor coupled to the inductor and to the capacitor for selectively coupling the inductor to the cascode gain stage in response to a control signal received at a gate of the third transistor to increase an inductance at the gate of the second transistor.

10. The LNA of claim 9, wherein each of the plurality of cascode gain stages is coupled to a respective variable gain network.

11. The LNA of claim 10, wherein the first transistor has an input matching network coupled to its gate.

12. The LNA of claim 10, wherein the second transistor includes a drain coupled to an output matching network.

13. A method, comprising:
receiving a radio frequency (RF) signal at an input node coupled to a gate of a first transistor of a first cascode gain stage;
increasing an amplitude of the RF signal at the cascode gain stage; and
selectively coupling a first gain boosting inductor of a first variable gain network to a gate of a second transistor of the first cascode gain stage in response receiving a control signal at a gate of a third transistor to increase an impedance at the gate of the second transistor thereby further increasing the amplitude of the RF signal.

14. The method of claim 13, wherein the first gain boosting inductor is coupled to the cascode gain stage through the third transistor and a first capacitor.

15. The method of claim 13, wherein the
first transistor has a source coupled to ground and a gate coupled to the input node,
the second transistor has a source coupled to a drain of the first transistor and a drain coupled to an output node.

16. The method of claim 13, further comprising:
outputting an intermediate RF signal from the first cascode gain stage to a second cascode gain stage, the intermediate RF signal having the further increased amplitude; and
increasing an amplitude of the intermediate RF signal at the second cascode gain stage.

17. The method of claim 16, further comprising selectively coupling a second gain boosting inductor of a second variable gain network to the second cascode gain stage to further increase the amplitude of the intermediate RF signal, wherein the intermediate RF signal is output to the second cascode gain stage from the first cascode gain stage through an interstage matching network.

18. The method of claim 17, wherein
the first transistor of the first cascode gain stage has a source coupled to ground, and the second transistor has a source coupled to a drain of the first transistor and a drain coupled to an output node, and a gate coupled to the third transistor of the variable gain network; and
the second cascode gain stage includes
a fourth transistor having a source coupled to ground and a gate coupled to the output node of the first cascode gain stage, and
a fifth transistor having a source coupled to a drain of the fourth transistor, a drain coupled to an output node, and a gate coupled to the second variable gain network.

19. The method of claim 18, further comprising:
outputting an output RF signal to the output node of the second cascode gain stage, the output RF signal having the further increased amplitude of the intermediate RF signal.

* * * * *